United States Patent [19]
Horio et al.

[11] Patent Number: 6,043,424
[45] Date of Patent: Mar. 28, 2000

[54] THERMOELECTRIC ALLOY ACHIEVING LARGE FIGURE OF MERIT BY REDUCING OXIDE AND PROCESS OF MANUFACTURING THEREOF

[75] Inventors: Yuma Horio; Hiroyuki Yamashita; Toshiharu Hoshi, all of Shizuoka, Japan

[73] Assignee: Yamaha Corporation, Japan

[21] Appl. No.: 08/887,594

[22] Filed: Jul. 3, 1997

[30] Foreign Application Priority Data

Jul. 3, 1996 [JP] Japan .................................. 8-174011

[51] Int. Cl.⁷ .................................................. H01L 35/12
[52] U.S. Cl. ........................................................ 136/236.1
[58] Field of Search .............................. 136/205, 203, 136/238

[56] References Cited

U.S. PATENT DOCUMENTS

| | | | |
|---|---|---|---|
| 3,762,960 | 10/1973 | Skrabek et al. | 148/3 |
| 3,853,550 | 12/1974 | Nikolaev et al. | 75/213 |
| 3,945,855 | 3/1976 | Skrabek et al. | 136/238 |
| 4,447,277 | 5/1984 | Jayadev et al. | 148/400 |
| 4,491,679 | 1/1985 | Moore | 136/203 |
| 4,717,789 | 1/1988 | Rauch, Sr. et al. | 136/238 |
| 4,764,212 | 8/1988 | Okumura | 75/228 |
| 4,902,648 | 2/1990 | Ohta et al. | 437/247 |
| 5,103,286 | 4/1992 | Ohta et al. | 357/68 |
| 5,108,515 | 4/1992 | Ohta et al. | 136/201 |
| 5,436,467 | 7/1995 | Elsner et al. | 257/15 |
| 5,458,867 | 10/1995 | Ritter | 423/509 |
| 5,726,381 | 3/1998 | Horio et al. | 136/236.1 |
| 5,763,293 | 6/1998 | Yamashita et al. | 438/55 |

*Primary Examiner*—Kathryn Gorgos
*Assistant Examiner*—Erica Smith-Hicks
*Attorney, Agent, or Firm*—Ostrolenk, Faber, Gerb & Soffen, LLP

[57] ABSTRACT

Oxide is undesirably grown on the surface of grains of thermoelectric alloy, and the resistivity of the thermoelectric alloy is decreased due to the oxide; however, the oxide is reduced with hydrogen gas before the powder is solidified, and the pieces of thermoelectric alloy produced from the oxygen-free powder achieve a large figure of merit.

6 Claims, 6 Drawing Sheets

THERMOELECTRIC ALLOY ACHIEVING LARGE FIGURE OF MERIT BY REDUCING OXIDE AND PROCESS OF MANUFACTURING THEREOF

FIELD OF THE INVENTION

This invention relates to thermoelectric alloy and a process of manufacturing thereof and, more particularly, to thermoelectric alloy with a large figure of merit and a process of manufacturing thereof.

DESCRIPTION OF THE RELATED ART

A typical process sequence for the thermoelectric alloy starts with preparation of molten thermoelectric alloy. The molten thermoelectric alloy is quenched so as to produce laminae of the thermoelectric alloy. The laminae of thermoelectric alloy is pulverized into powder, and the powder is solidified through a sintering.

The figure of merit z represents properties of the thermoelectric alloy, and is expressed by equation 1.

$$z = \text{alpha}^2/(\text{rho} \times \text{kappa}) \qquad \text{equation 1}$$

where alpha is Seebeck coefficient, rho is electric resistivity in ohm-m and kappa is heat conductivity in W/m-° K. Equation 1 teaches us that small resistivity or small heat conductivity makes the figure of merit large. The larger the figure of merit is, the better the thermoelectric alloy is.

However, while the laminae of thermoelectric alloy is being powdered, the grain boundaries are oxidized, and oxide is grown along the grain boundaries. The oxide gives rise to increase the resistivity rho, and the figure of merit of the prior art thermoelectric alloy is less than $4.0 \times 10^{-3}/°$ k.

SUMMARY OF THE INVENTION

It is therefore an important object of the present invention to provide thermoelectric alloy the figure of merit of which is equal to or greater than $4.0 \times 10^{-3}/°$ K.

It is also an important object of the present invention to provide a process of manufacturing the thermoelectric alloy.

To accomplish the object, the present invention proposes to reduce the oxide grown on grains with hydrogen gas so as to decrease residual oxygen equal to or less than 1500 ppm by weight.

In accordance with one aspect of the present invention, there is provided thermoelectric alloy essentially consisting of at least one element selected from the group consisting of Bi and Sb and at least one element selected from the group consisting of Te and Se, and the thermoelectric alloy has p conductivity type, grain size equal to or less than 50 microns and residual oxygen content equal to or less than 1500 ppm by weight.

In accordance with another aspect of the present invention, there is provided thermoelectric alloy essentially consisting of at least one element selected from the group consisting of Bi and Sb, at least one element selected from the group consisting of Te and Se and at least one element selected from the group consisting of I, Cl, Hg, Br, and the thermoelectric alloy has n conductivity type, grain size equal to or less than 50 microns and residual oxygen content equal to or less than 1500 ppm by weight.

In accordance with yet another aspect of the present invention, there is provided a process of manufacturing thermoelectric alloy, comprising the steps of: a) preparing molten mixture containing at least one element selected from the group consisting of Bi and Sb and one element selected from the group consisting of Te and Se; b) producing powder of thermoelectric alloy from the molten mixture, the powder of thermoelectric alloy partially reacting with oxygen so that the powder contains oxide; c) reducing the oxide with hydrogen so as to remove the oxide from the powder; and d) solidifying the powder of thermoelectric alloy under the conditions where the grains of the thermoelectric alloy were not enlarged.

In accordance with still another aspect of the present invention, there is provided a process of manufacturing thermoelectric alloy, comprising the steps of: a) preparing molten mixture containing at least one element selected from the group consisting of Bi and Sb, one element selected from the group consisting of Te and Se and at least one element selected from the group consisting of I, Cl, Hg and Br; b) producing powder of thermoelectric alloy from the molten mixture, the powder of thermoelectric alloy partially reacting with oxygen so that the powder contains oxide; c) reducing the oxide with hydrogen so as to remove the oxide form the powder; and d) solidifying the powder of thermoelectric alloy under the conditions where the grains of the thermoelectric alloy were not enlarged.

The reducing may be carried out in the hydrogen gas at 200 degrees to 500 degrees in centigrade for 10 hours to 50 hours after creation of vacuum equal to or less than $1 \times 10^{-2}$ torr.

BRIEF DESCRIPTION OF THE DRAWINGS

The features and advantages of the thermoelectric alloy and the process according to the present invention will be more clearly understood from the following description taken in conjunction with the accompanying drawings in which.

DESIRABLE REDUCING CONDITIONS

Temperature

Desirable reducing temperature ranged from 200 degrees to 500 degrees in centigrade. The reason for the reducing temperature range is as follows.

When the reducing temperature was lower than 200 degrees in centigrade, the oxide was insufficiently reduced, and residual oxide was left on the grains of the thermoelectric alloy. The residual oxide kept the resistivity of the resultant thermoelectric alloy high, and figure of merit was not improved.

On the other hand, when the reducing temperature was higher than 500 degrees in centigrade, low-boiling point substance such as Te and/or Se was vaporized, and holes were formed in the grains. The holes gave rise to increase of the resistivity. Moreover, Seebeck coefficient of the resultant thermoelectric alloy was decreased due to the deviation of the composition from the stoichiometry. This resulted in decrease of the figure of merit.

Figure 1:
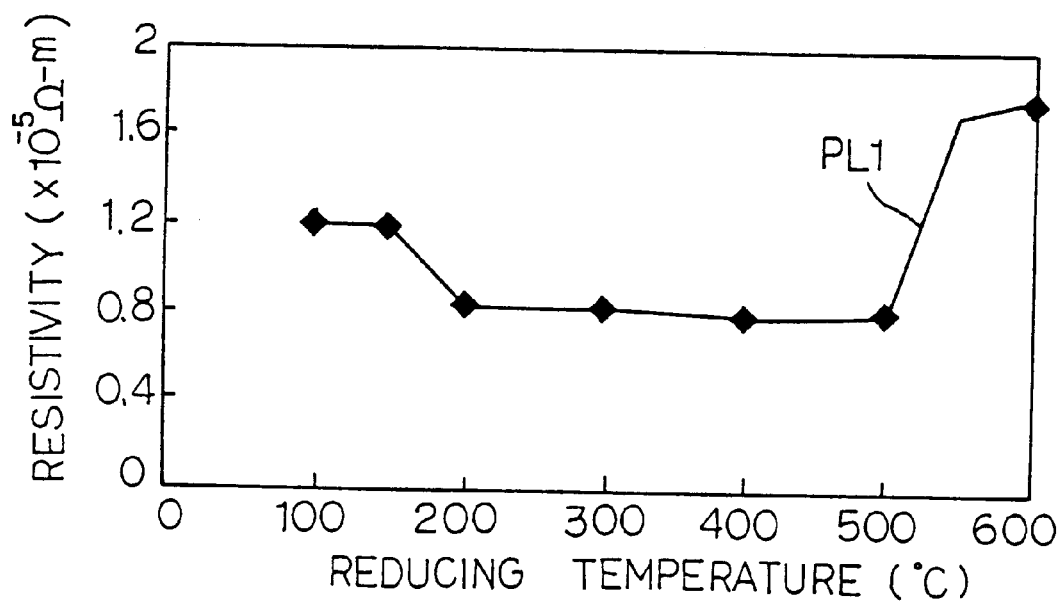
FIG. 1 is a graph showing relation between the resistivity of thermoelectric alloy and reducing temperature.
Figure 2:
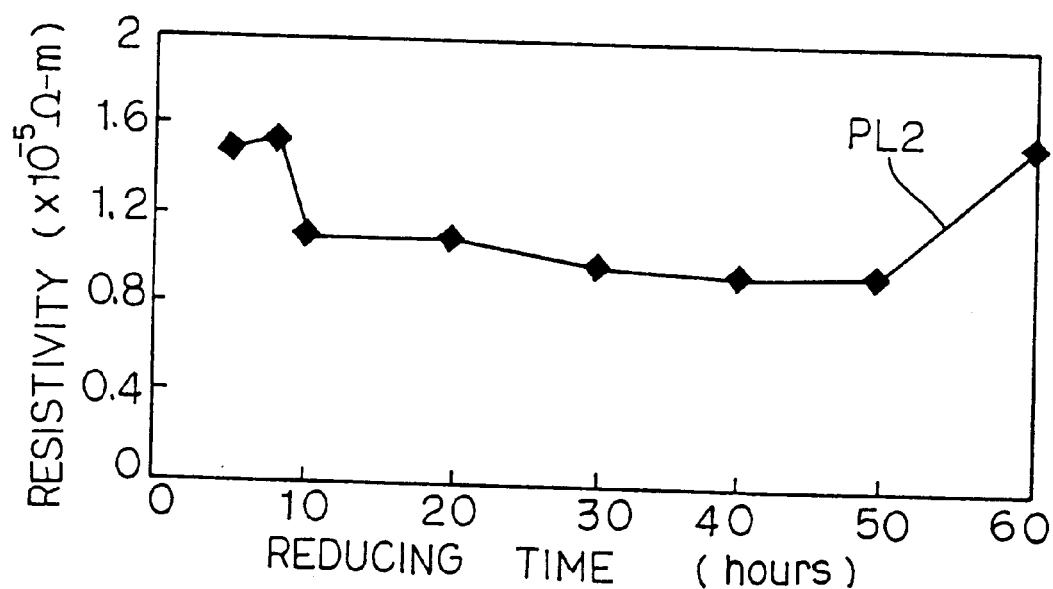
FIG. 2 is a graph showing relation between the resistivity of thermoelectric alloy and reducing time.

FIG. 1 illustrates the relation between the reducing temperature and the resistivity of a kind of thermoelectric alloy, and the experiment result supports the above described reducing temperature range.

The experiment was carried out as follows. $SbI_3$ was added to $Bi_2Te_{2.85}Se_{0.15}$ at 0.2 weight percent, and the molten mixture was cooled down by using a rapid liquid-phase quenching technique. Laminae of the thermoelectric alloy were made from the molten mixture, and were less than 10 microns thick. The laminae of thermoelectric alloy were sealed in a pyrex tube. The pyrex tube was evacuated, and hydrogen gas was introduced therein. The laminae of thermoelectric alloy were heated in hydrogen ambience for 10 hours, and undesirable oxide was reduced. The temperature was changed from 100 degrees in centigrade to 600 degrees in centigrade, and the present inventor obtained samples. After the reducing, the samples were solidified into pieces of thermoelectric alloy by using a hot pressing at 425 degrees in centigrade for 60 minutes under 4 tonf/cm$^2$, and the present inventor measured the resistivity of the pieces of thermoelectric alloy.

Plots PL1 taught that the resistivity was decreased between 200 degrees and 500 degrees in centigrade, and the desirable reducing temperature was determined to range between 200 degrees and 500 degrees in centigrade.

Reducing Time

Desirable reducing time ranged from 10 hours to 50 hours. When the reducing time was less than 10 hours, the oxide was insufficiently reduced, and the resistivity was still large. On the other hand, when the thermoelectric alloy was reduced for more than 50 hours, the low boiling point substance such as Te and/or Se was vaporized, and holes were formed in the grains. The holes increased the resistivity, and decreased the Seebeck coefficient.

The following experiment supports the above described reducing time. Te was added to $Bi_{0.5}Sb_{1.5}Te_3$ at 1.5 weight percent, and the molten mixture was cooled down by using a rapid liquid-phase quenching technique. Laminae of the thermoelectric alloy were made from the molten mixture, and were pulverized into powder. The powder was sealed in a pyrex tube. The pyrex tube was evacuated, and hydrogen gas was introduced therein. The powder of thermoelectric alloy was heated in hydrogen ambience at 370 degrees in centigrade, and the reducing time was changed from 5 hours to 60 hours. The present inventor obtained samples different in reducing time. After the reducing, the samples were solidified into pieces of thermoelectric alloy by using a hot pressing at 400 degrees in centigrade for 90 minutes under 3 tonf/cm$^2$, and the present inventor measured the resistivity of the pieces of thermoelectric alloy.

Plots PL2 taught that the resistivity was decreased between 10 hours and 50 hours, and the present inventor determined the desirable reducing time to range between 10 hours and 50 hours.

Reducing Pressure

Desirable reducing pressure was equal to or less than $1\times10^{-2}$ torr. When the inside of the pyrex tube was higher than $1\times10^{-2}$ torr, the residual oxygen reacted with the thermoelectric alloy, and

FEATURES OF THERMOELECTRIC ALLOY

Grain Size

The present inventor investigated influences of the grain size of the thermoelectric alloy as follows. The present inventor produced various samples of thermoelectric alloy different in grain size, and measured the resistivity of the samples. Te was added to $Bi_{0.5}Sb_{1.5}Te_3$ at 1 weight percent, and the samples were produced from the mixture as similar to the samples described hereinbefore.

Figure 3:
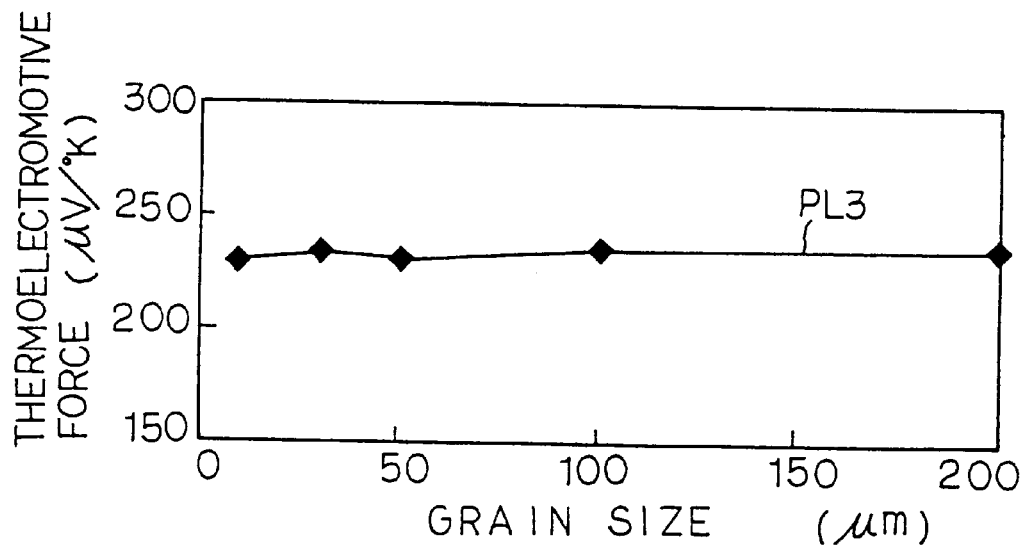
FIG. 3 is a graph showing relation between the thermoelectromotive force of thermoelectric alloy and the grain size.

First, the present inventor measured the thermoelectromotive force, and plotted the thermoelectromotive force in terms of the grain size as shown in FIG. 3. Plots PL3 taught that the grain size did not have a substantial influence on the thermoelectromotive force of the thermoelectric alloy.

Figure 4:
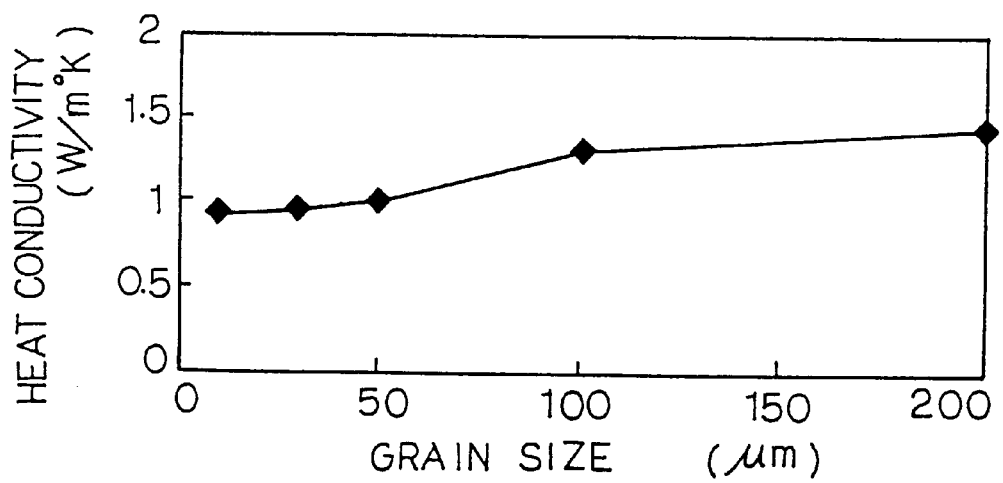
FIG. 4 is a graph showing relation between the heat conductivity of the thermoelectric alloy and the grain size.

Subsequently, the present inventor measured the heat conductivity, and plotted the heat conductivity in terms of the grain size as shown in FIG. 4. The heat conductivity was increased together with the grain size, and the increment was large between 50 microns to 100 microns.

Figure 5:
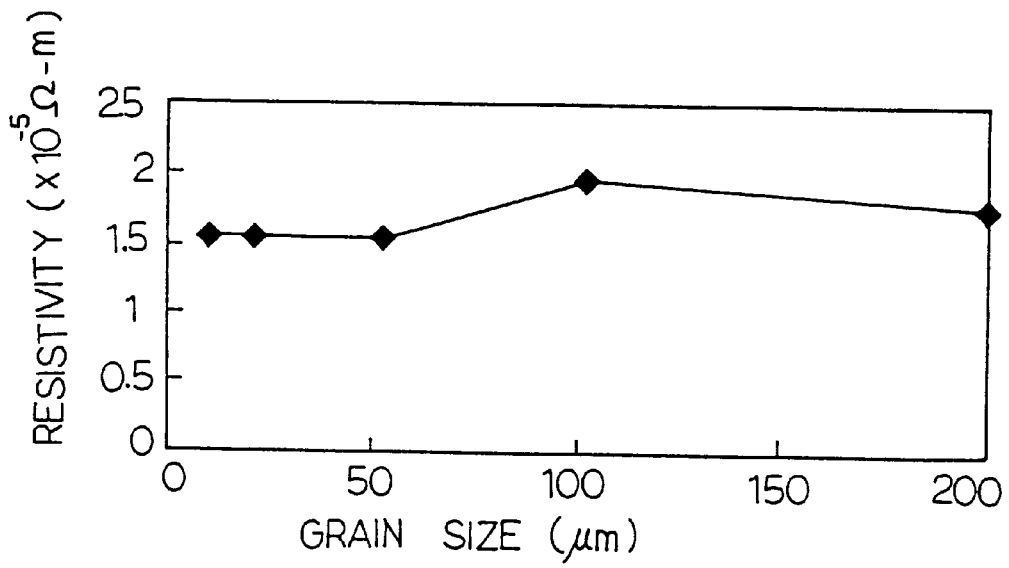
FIG. 5 is a graph showing relation between the resistivity of the thermoelectric alloy and the grain size.

Subsequently, the present inventor measured the resistivity, and plotted the resistivity in terms of the grain size as shown in FIG. 5. The resistivity was constant in so far as the grain size was equal to or less than 50 microns. However, when the grain size exceeded 50 microns, the resistivity was increased together with the grain size.

Figure 6:
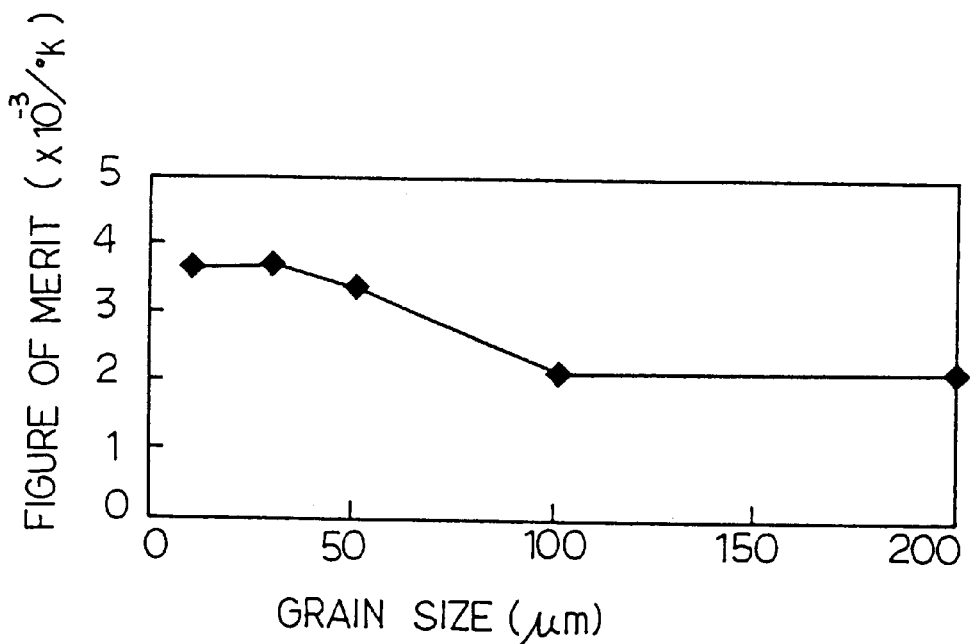
FIG. 6 is a graph showing relation between the figure of merit of the thermoelectric alloy and the grain size of the crystal.

Finally, the present inventor calculated the figure of merit, and plotted the figure of merit in terms of the grain size as shown in FIG. 6. The figure of merit was widely decreased between 50 microns and 100 microns. The present inventor determined the desirable grain size to be equal to or less than 50 microns.

Oxygen Content

Figure 7:
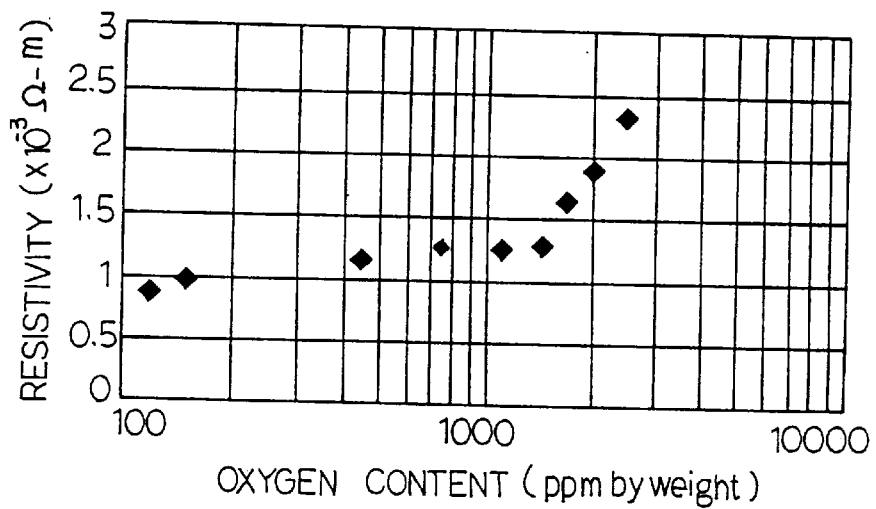
FIG. 7 is a graph showing relation between the figure of merit of thermoelectric alloy and residual oxygen contained in the thermoelectric alloy.

Residual oxygen content was a criterion for evaluating the reducing process. The present inventor added Te to $Bi_{0.5}Sb_{1.5}Te_3$ at 1.5 weight percent, and powder was made from the molten mixture as similar to the samples described hereinbefore. The grain size was 30 microns, and samples were produced from the thermoelectric alloy, and were different in oxygen content. The present inventor measured the resistivity, and plotted the resistivity of the samples as shown in FIG. 7.

When the oxygen content exceeded 1500 ppm, the resistivity was drastically increased. The reason why the residual oxygen decreased the resistivity was that the carrier was scattered by the oxide films grown along the grain boundaries of the thermoelectric alloy. The large resistivity resulted in a small figure of merit. For this reason, the present inventor determined the residual oxygen content to be equal to or less than 1500 ppm by weight.

DESCRIPTION OF THE PREFERRED EMBODIMENTS

Figure 8A:
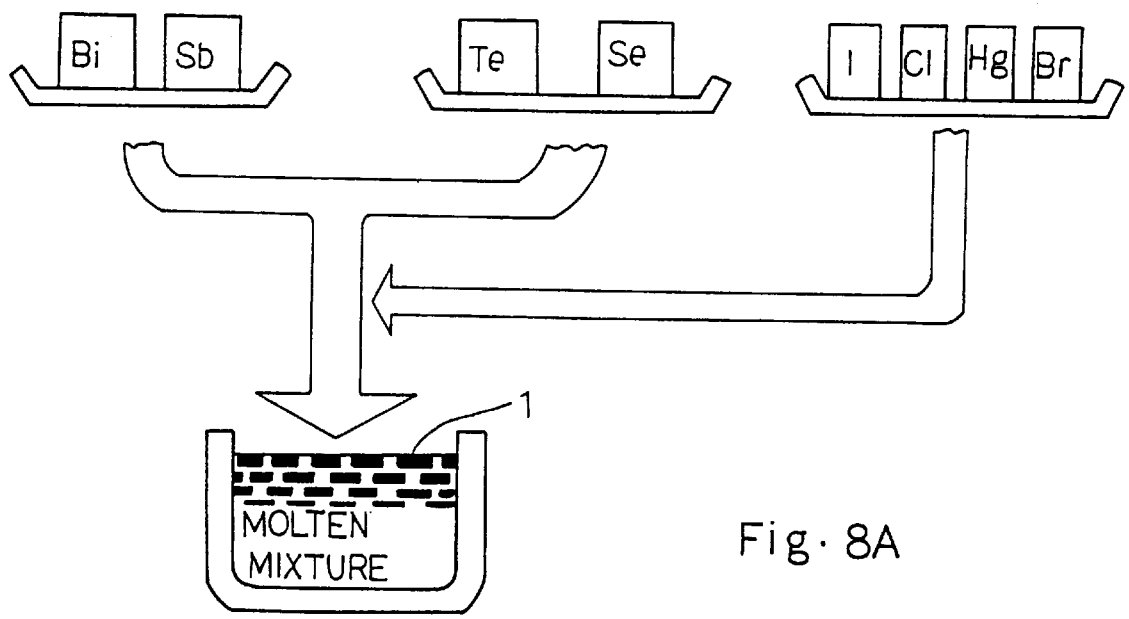
FIGS. 8A to 8E are schematic views showing a process of manufacturing thermoelectric alloy according to the present invention.

A process of manufacturing thermoelectric alloy is described with reference to FIGS. 8A to 8E of the drawings. The process starts with preparation of molten mixture 1. The molten mixture contains at least one element selected from the group consisting of Bi and Sb and at least one element selected from the group consisting of Te and Se. When the n-type conductivity is given to thermoelectric alloy, $SbI_3$, $AgI$, $HgBr_2$ or $HgCl_2$ may be added thereto as shown in FIG. 8A.

Figure 8B:
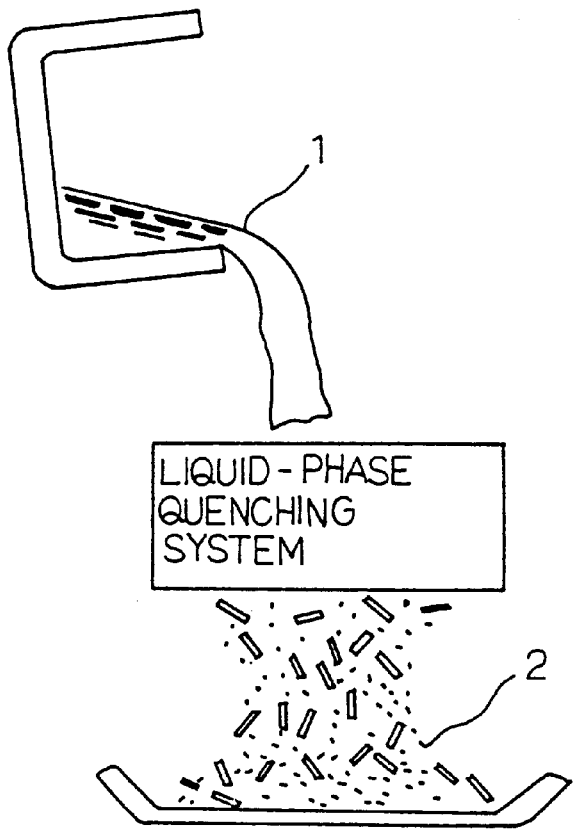

The molten mixture is cooled down at $10^3$ to $10^{6\circ}$ K./second by using a liquid-phase quenching technique such as, for example, a single rolling method. As a result, mixture 2 of laminae and powder is obtained as shown in FIG. 8B.

Figure 8C:
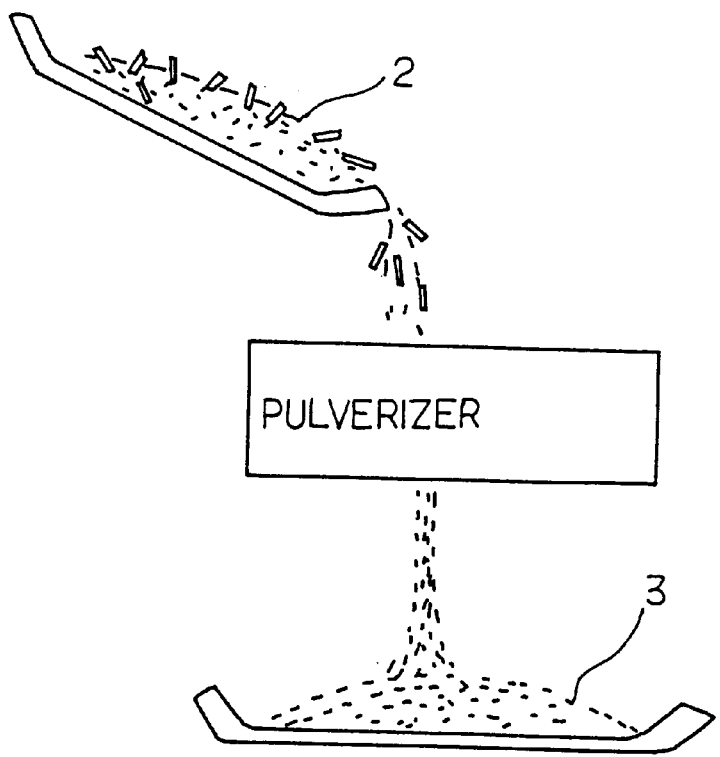

Subsequently, the mixture 2 is pulverized into powder 3 of thermoelectric alloy as shown in FIG. 8C, and the grain size of the powder 3 is equal to or less than 50 microns. The powder 3 is unintentionally oxidized, and oxide is grown on the surface of the grains of the thermoelectric alloy.

Figure 8D:
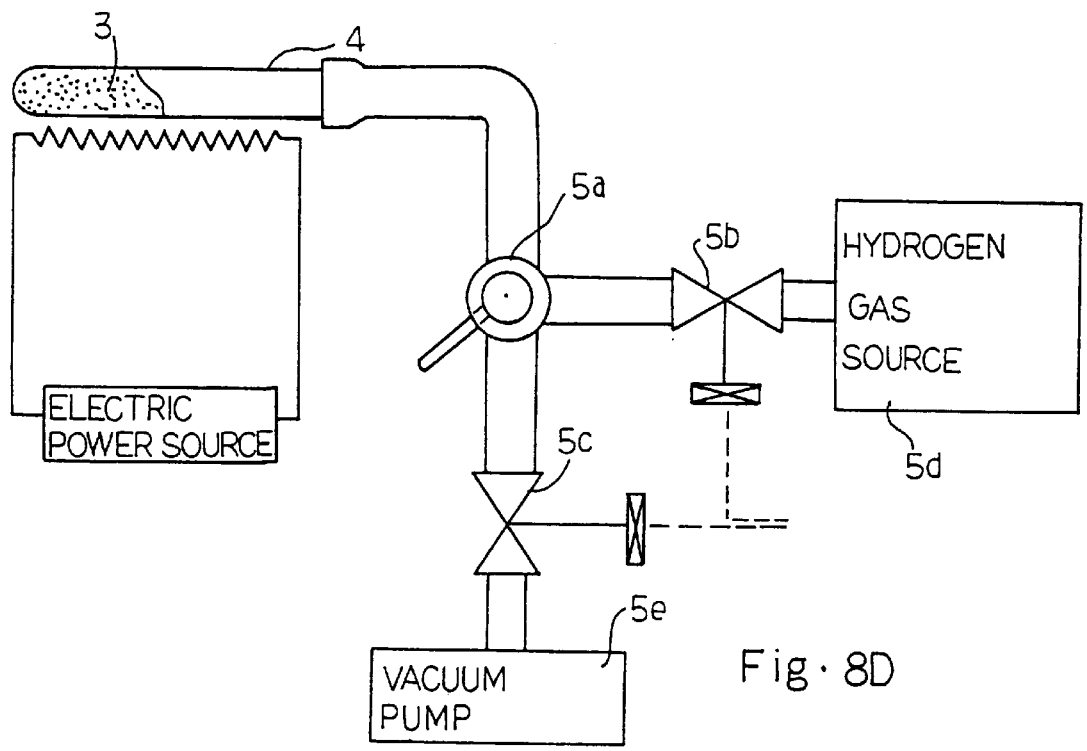

The powder 3 is sealed in a pyrex tube 4, and the pyrex tube 4 is connected through a change-over valve 5a and a stop valve 5b/5c to a hydrogen gas source 5d or a vacuum pump 5e (see FIG. 8D).

Firstly, the pyrex tube 4 is connected to the vacuum pump 5e, and the vacuum pump 5e evacuates the air from the inner space of the pyrex tube 4. Then, vacuum is created at $1\times10^{-2}$ torr or less.

Subsequently, the hydrogen gas is introduced into the inner space of the pyrex tube 4, and the powder 3 is heated at 200 degrees to 500 degrees in centigrade for 10 hours to 50 hours. Thus, the powder 3 of thermoelectric alloy is reduced with the hydrogen gas, and the oxide is removed from the powder.

Upon completion of the reducing, the oxide is removed from the powder 3, and the reduced powder 3' is taken out from the pyrex tube 4.

Figure 8E:
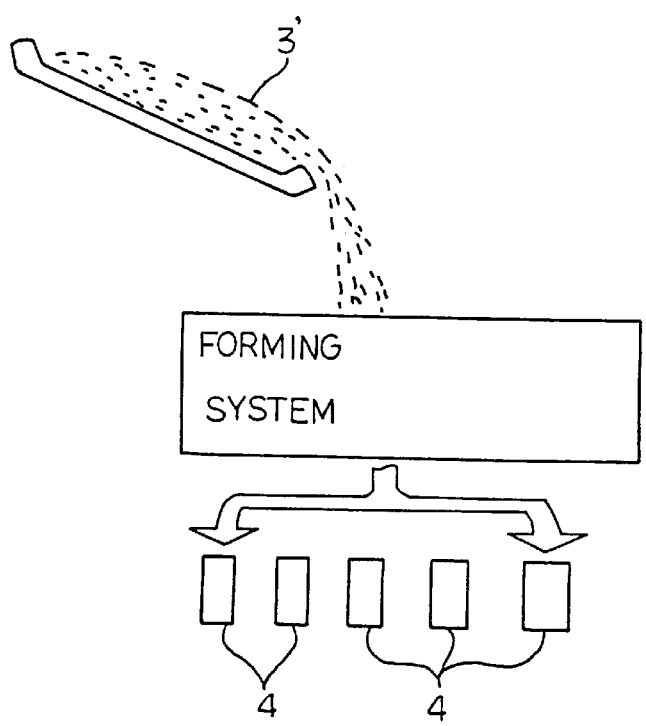

The reduced powder 3' is solidified into pieces 4 of thermoelectric alloy under the conditions where the grains are not enlarged as shown in FIG. 8E. A hot pressing, an extrusion molding and a discharging plasma assisted sintering are available for the solidification.

If the hot pressing is used, the pressure is regulated to 400 kgf/cm$^2$, the temperature is regulated to 300 degrees to 500 degrees in centigrade, the time is regulated to 30 minutes to 180 minutes, and the ambience is selected from vacuum and argon. Then, the reduced powder 3' is solidified without enlargement of the grains. When the heat fluxes are aligned with the direction of the pressure applied to the reduced powder 3', c-axis of the crystal is grown in the direction of the pressure, and the resultant thermoelectric alloy is improved in the figure of merit.

The discharging plasma-assisted sintering is carried out as follows. Discharging plasma is created, and the ion applies impact to the reduced powder. Moreover, pressure is applied to the reduced powder 3', and is heated so as to be solidified without enlargement of the grains.

The present inventor produced samples of thermoelectric alloy according to the present invention and comparative samples, and confirmed the advantages of the removal of oxide. The present inventor produced samples 1 to 7 and comparative samples 8 to 15, and the composition was shown in Table 1. Samples 1 to 7 falls within the scope of the present invention, and samples 8 to 15 were out of the technical scope of the present invention.

The reducing conditions and the solidification technology of samples 1 to 7 were summarized in Table 2. Comparative samples 8 to 15 were not reduced, and only the solidification technology was taught in Table 3.

TABLE 1

| Sample No. | Composition |
|---|---|
| 1 | $Bi_{0.5}Sb_{1.5}Te_3$ + Te 2 wt % |
| 2 | $Bi_{1.9}Sb_{0.1}Te_{2.85}Se_{0.15}$ + $SbI_3$ 0.15 wt % |
| 3 | $Bi_{0.4}Sb_{1.6}Te_3$ + Te 4 wt % |
| 4 | $Bi_{0.5}Sb_{1.5}Te_3$ + Te 1 wt % |
| 5 | $Bi_{1.85}Sb_{0.15}Te_{2.85}Se_{0.15}$ + $HgBr_2$ 0.1 wt % |
| 6 | $Bi_{0.5}Sb_{1.5}Te_3$ |
| 7 | $Bi_{1.8}Sb_{0.2}Te_{2.85}Se_{0.15}$ + $HgBr_2$ 0.09 wt % |
| 8 | $Bi_{0.5}Sb_{1.5}Te_3$ + Te 2 wt % |

TABLE 1-continued

| Sample No. | Composition |
|---|---|
| 9 | $Bi_{1.9}Sb_{0.1}Te_{2.85}Se_{0.15}$ + $SbI_3$ 0.15 wt % |
| 10 | $Bi_{0.4}Sb_{1.6}Te_3$ + Te 4 wt % |
| 11 | $Bi_{0.5}Sb_{1.5}Te_3$ + Te 1 wt % |
| 12 | $Bi_{1.85}Sb_{0.15}Te_{2.85}Se_{0.15}$ + $HgBr_2$ 0.1 wt % |
| 13 | $Bi_{0.5}Sb_{1.5}Te_3$ |
| 14 | $Bi_{1.8}Sb_{0.2}Te_{2.85}Se_{0.15}$ + $HgBr_2$ 0.09 wt % |
| 15 | $Bi_{0.5}Sb_{1.5}Te_3$ + Te 2 wt % |

TABLE 2

| | Reducing Conditions | | | |
|---|---|---|---|---|
| Sample No. | Temp. °C. | Time Hr | Vacuum torr | Solidification |
| 1 | 370 | 24 | $3 \times 10^{-3}$ | hot press 400° C., 80 min, 4 ton/cm$^2$ |
| 2 | 370 | 10 | $3 \times 10^{-3}$ | hot press 430° C., 60 min, 4 ton/cm$^2$ |
| 3 | 300 | 12 | $2 \times 10^{-3}$ | hot press 400° C., 80 min, 4 ton/cm$^2$ |
| 4 | 450 | 12 | $5 \times 10^{-3}$ | extrusion molding ration = 20, 400° C. |
| 5 | 500 | 10 | $1 \times 10^{-3}$ | extrusion molding ratio = 30, 300° C. |
| 6 | 200 | 50 | $8 \times 10^{-3}$ | discharge plasma sintering 250° C., 3 tonf/cm$^2$ |
| 7 | 280 | 24 | $1 \times 10^{-3}$ | discharge plasma sintering 400° C., 5 tonf/cm$^2$ |

TABLE 3

| | Reducing conditions | | | |
|---|---|---|---|---|
| Sample No. | Temp. °C. | Time Hr | Vacuum torr | Solidification |
| 8 | — | — | — | hot press 400° C., 80 min, 4 ton/cm$^2$ |
| 9 | — | — | — | hot press 430° C., 60 min, 4 ton/cm$^2$ |
| 10 | — | — | — | hot press 400° C., 80 min, 4 ton/cm$^2$ |
| 11 | — | — | — | extrusion molding ratio = 20, 400° C. |
| 12 | — | — | — | extrusion molding ratio = 30, 300° C. |
| 13 | — | — | — | discharge plasma sintering 250° C., 3 tonf/cm$^2$ |
| 14 | — | — | — | discharge plasma sintering 400° C., 5 tonf/cm$^2$ |
| 15 | — | — | — | hot press 430° C., 30 min, 4 ton/cm$^2$ |

The present inventor measured the resistivity, i.e., rho, the heat conductivity, i.e., kappa and Seebeck coefficient, i.e., alpha, and calculated the figure of merit z (see table 4).

The present inventor further measured the residual oxygen content by using non-dispersive infrared absorbing analysis method. In detail, the present inventor heated the samples in graphite crucible. Then, the residual oxygen reacted with carbon, and CO gas was produced. He carried CO gas to the infrared detector, and measured the CO gas concentration. The CO gas concentration was converted to the residual oxygen content (see table 4)

TABLE 4

| Sample No. | Grain size (um) | Oxygen content (ppm) | Rho (ohm-m) | Kappa (w/mK) | Alpha (uV/K) | Z (1/K) |
|---|---|---|---|---|---|---|
| 1 | 8 | 400 | $1.21 \times 10^{-5}$ | 0.98 | 232 | $4.54 \times 10^{-3}$ |
| 2 | 15 | 430 | $0.89 \times 10^{-5}$ | 1.12 | −201 | $4.05 \times 10^{-3}$ |
| 3 | 8 | 800 | $0.82 \times 10^{-5}$ | 1.12 | 199 | $4.31 \times 10^{-3}$ |
| 4 | 35 | 350 | $0.89 \times 10^{-5}$ | 1.17 | 213 | $4.36 \times 10^{-3}$ |
| 5 | 25 | 1300 | $0.81 \times 10^{-5}$ | 1.23 | −203 | $4.14 \times 10^{-3}$ |
| 6 | 9 | 1500 | $0.81 \times 10^{-5}$ | 1.05 | 203 | $4.85 \times 10^{-3}$ |
| 7 | 50 | 650 | $0.79 \times 10^{-5}$ | 1.28 | −212 | $4.44 \times 10^{-3}$ |
| 8 | 15 | 1600 | $1.71 \times 10^{-5}$ | 0.92 | 230 | $3.36 \times 10^{-3}$ |
| 9 | 11 | 1850 | $1.10 \times 10^{-5}$ | 1.18 | −209 | $3.37 \times 10^{-3}$ |
| 10 | 28 | 1950 | $1.05 \times 10^{-5}$ | 1.11 | 201 | $3.47 \times 10^{-3}$ |
| 11 | 35 | 1800 | $1.42 \times 10^{-5}$ | 1.16 | 211 | $2.70 \times 10^{-3}$ |
| 12 | 18 | 1700 | $0.98 \times 10^{-5}$ | 1.21 | −205 | $3.54 \times 10^{-3}$ |
| 13 | 8 | 1850 | $1.55 \times 10^{-5}$ | 1.08 | 205 | $2.51 \times 10^{-3}$ |
| 14 | 10 | 1850 | $0.95 \times 10^{-5}$ | 1.25 | −210 | $3.71 \times 10^{-3}$ |
| 15 | 65 | 1750 | $1.81 \times 10^{-5}$ | 1.31 | 229 | $2.21 \times 10^{-3}$ |

Comparing samples 1 to 7 with comparative samples 8 to 15, the samples 1 to 7 achieved the figure of merit greater than $4 \times 10^{-3}$. Samples 1 to 7 were identical in composition and the solidification technology with comparative samples 8 to 14, and the difference was only the hydrogen reducing. Therefore, the hydrogen reducing was the reason why samples 1 to 7 achieved the large figure of merit.

The present inventor further produced samples 16 to 28. Samples 16 to 19 were within the technical scope of the present invention, and samples 20 to 28 were out of the technical scope of the present invention. The composition, the method of solidification, the reducing conditions and the properties were summarized in table 5 to table 7

TABLE 5

| Sample No. | Composition |
|---|---|
| 16 | $Bi_{1.9}Sb_{0.1}Te_{2.85}Se_{0.15}$ + AgI 0.09 wt % |
| 17 | $Bi_{1.8}Sb_{0.2}Te_{2.85}Se_{0.15}$ + CuI 0.15 wt % |
| 18 | $Bi_{1.9}Sb_{0.1}Te_{2.85}Se_{0.15}$ + $HgCl_2$ 0.09 wt % |
| 19 | $Bi_2Te_{2.85}Se_{0.15}$ + AgI 0.1 wt % |
| 20 | $Bi_{0.5}Sb_{1.5}Te_3$ + Te 2 wt % |
| 21 | $Bi_{1.9}Sb_{0.1}Te_{2.85}Se_{0.15}$ + $SbI_3$ 0.15 wt % |
| 22 | $Bi_{0.4}Sb_{1.6}Te_3$ + Te 4 wt % |
| 23 | $Bi_2Te_{2.85}Se_{0.15}$ + $SbI_3$ 0.1 wt % |
| 24 | $Bi_2Te_{2.85}Se_{0.15}$ + $HbBr_2$ 0.1 wt % |
| 25 | $Bi_{1.9}Sb_{0.1}Te_{2.85}Se_{0.15}$ + AgI 0.12 wt % |
| 26 | $Bi_{1.8}Sb_{0.2}Te_{2.85}Se_{0.15}$ + CuI 0.09 wt % |
| 27 | $Bi_{1.9}Sb_{0.1}Te_{2.85}Se_{0.15}$ + $HgCl_2$ 0.10 wt % |
| 28 | $Bi_2Te_{2.85}Se_{0.15}$ + AgI 0.12 wt % |

TABLE 6

| | Reducing Conditions | | | |
|---|---|---|---|---|
| Sample No. | Temp. ° C. | Time Hr | Vacuum torr | Solidification |
| 16 | 370 | 24 | $1 \times 10^{-3}$ | hot press 400° C., 60 min, 4 tonf/cm² |
| 17 | 400 | 12 | $1 \times 10^{-3}$ | hot press 400° C., 30 min, 4 tonf/cm² |
| 18 | 370 | 10 | $2 \times 10^{-3}$ | extrusion molding ratio = 25, 400° C. |
| 19 | 430 | 10 | $2 \times 10^{-3}$ | discharge plasma sintering 350° C., 5 tonf/cm² |
| 20 | 180 | 30 | $3 \times 10^{-3}$ | hot press, 430° C. 60 min., 4 ton/cm² |
| 21 | 510 | 15 | $4 \times 10^{-3}$ | hot press, 370° C. 30 min., 4 ton/cm² |
| 22 | 450 | 5 | $3 \times 10^{-3}$ | extrusion molding ratio = 20, 400° C. |
| 23 | 250 | 70 | $1 \times 10^{-3}$ | hot press 400° C., 30 min, 2 ton/cm² |
| 24 | 300 | 30 | $3 \times 10^{-2}$ | discharge plasma sintering 300° C., 2 ton/cm² |
| 25 | — | — | — | hot press, 400° C. 60 min., 4 tonf/cm² |
| 26 | — | — | — | hot press 400° C., 60 min, 4 tonf/cm² |
| 27 | — | — | — | extrusion molding ratio = 30, 400° C. |
| 28 | — | — | — | discharge plasma sintering 350° C., 5 tonf/cm² |

TABLE 7

| Sample No. | Grain size (um) | Oxygen content (ppm) | Rho (ohm-m) | Kappa (w/mK) | Alpha (uV/K) | Z (1/K) |
|---|---|---|---|---|---|---|
| 16 | 9 | 400 | $0.89 \times 10^{-5}$ | 1.05 | −200 | $4.28 \times 10^{-3}$ |
| 17 | 10 | 320 | $0.80 \times 10^{-5}$ | 1.12 | −201 | $4.51 \times 10^{-3}$ |
| 18 | 20 | 330 | $0.85 \times 10^{-5}$ | 1.17 | −203 | $4.14 \times 10^{-3}$ |
| 19 | 7 | 390 | $0.85 \times 10^{-5}$ | 1.1 | −206 | $4.53 \times 10^{-3}$ |
| 20 | 25 | 1800 | $1.51 \times 10^{-5}$ | 1 | 227 | $3.41 \times 10^{-3}$ |
| 21 | 58 | 1100 | $1.32 \times 10^{-5}$ | 1.12 | −160 | $1.75 \times 10^{-3}$ |
| 22 | 15 | 1800 | $1.12 \times 10^{-5}$ | 1.11 | 202 | $3.28 \times 10^{-3}$ |
| 23 | 60 | 1000 | $1.11 \times 10^{-5}$ | 1.21 | −155 | $1.79 \times 10^{-3}$ |
| 24 | 28 | 1950 | $1.25 \times 10^{-5}$ | 0.98 | −205 | $3.43 \times 10^{-3}$ |
| 25 | 30 | 1600 | $1.31 \times 10^{-5}$ | 1.05 | −200 | $2.91 \times 10^{-3}$ |
| 26 | 10 | 1900 | $1.25 \times 10^{-5}$ | 1.08 | −195 | $2.82 \times 10^{-3}$ |
| 27 | 60 | 1850 | $1.43 \times 10^{-5}$ | 1.22 | −190 | $2.07 \times 10^{-3}$ |
| 28 | 9 | 1600 | $1.20 \times 10^{-5}$ | 1.1 | −205 | $3.18 \times 10^{-3}$ |

Samples 16 to 19 also achieved the large figure of merit; however, samples 20 to 28 suffered from small figure of merit.

As will be appreciated from the foregoing description, the residual oxygen was removed from the thermoelectric alloy according to the present invention through the hydrogen reducing, and the reduced thermoelectric alloy achieved a large figure of merit.

Although particular embodiments of the present invention have been shown and described, it will be obvious to those skilled in the art that various changes and modifications may be made without departing from the spirit and scope of the present invention. For example, even though another kind of thermoelectric alloy is different in composition from those of the present invention, the hydrogen reducing is effective against a low resistivity in so far as the thermoelectric alloy is liable to be oxidized during the manufacturing.

What is claimed is:

1. Thermoelectric alloy essentially consisting of at least one element selected from the group consisting of Bi and Sb and at least one element selected from the group consisting of Te and Se, and having p conductivity type, grain size equal to or less than 50 microns and residual oxygen content equal to or less than 1500 ppm by weight, said alloy being made by a rapid liquid-phase quenching technique achieving about $10^3$ to $10^6$ degrees K/second.

2. Thermoelectric alloy essentially consisting of at least one element selected from the group consisting of Bi and Sb, at least one element selected from the group consisting of Te and Se and at least one element selected from the group consisting of I, Cl, Hg, Br, Ag and Cu and having n conductivity type, grain size equal to or less than 50 microns and residual oxygen content equal to or less than 1500 ppm by weight, said alloy being made by a rapid liquid-phase quenching technique achieving about $10^3$ to $10^6$ degrees K/second.

3. A process of manufacturing thermoelectric alloy, comprising the steps of:

a) preparing molten mixture containing at least one element selected from the group consisting of Bi and Sb and one element selected from the group consisting of Te and Se;

b) producing powder of thermoelectric alloy from the molten mixture by using at least a rapid liquid-phase quenching technique, achieving about $10^3$ to $10^6$ degrees K/second, said powder of thermoelectric alloy partially reacting with oxygen so that said powder contains oxide;

c) reducing said oxide with hydrogen so as to remove said oxide from said powder achieving an oxygen content less than or equal to 1500 ppm by weight; and d) solidifying said powder of thermoelectric alloy under the conditions where the grains of said thermoelectric alloy were not enlarged, said grains having a size of 50 microns or less.

4. The process as set forth in claim 3, in which said step c) includes the sub-steps of c-1) placing said powder of thermoelectric alloy into an inner space of a reactor, c-2) evacuating the air from said inner space so as to create vacuum equal to or less than $1\times10^{-2}$ torr, c-3) introducing hydrogen gas into said inner space, and c-4) heating said powder of thermoelectric alloy at 200 degrees to 500 degrees in centigrade for 10 hours to 50 hours.

5. A process of manufacturing thermoelectric alloy, comprising the steps of:

a) preparing molten mixture containing at least one element selected from the group consisting of Bi and Sb, one element selected from the group consisting of Te and Se and at least one element selected from the group consisting of I, Cl, Hg, Br, Ag and Cu;

b) producing powder of thermoelectric alloy from said molten mixture by using at least a rapid liquid-phase quenching technique, achieving about $10^3$ to $10^6$ degrees K/second, said powder of thermoelectric alloy partially reacting with oxygen so that said powder contains oxide;

c) reducing said oxide with hydrogen so as to remove said oxide from said powder achieving an oxygen content less than or equal to 1500 ppm by weight; and d) solidifying said powder of thermoelectric alloy under the conditions where the grains of said thermoelectric alloy were not enlarged, said grains having a size of 50 microns or less.

6. The process as set forth in claim 5, in which said step c) includes the sub-steps of c-1) placing said powder of thermoelectric alloy into an inner space of a reactor, c-2) evacuating the air from said inner space so as to create vacuum equal to or less than $1\times10^{-2}$ torr, c-3) introducing hydrogen gas into said inner space, and c-4) heating said powder of thermoelectric alloy at 200 degrees to 500 degrees in centigrade for 10 hours to 50 hours.

* * * * *